(12) United States Patent
Schröder et al.

(10) Patent No.: US 8,649,405 B2
(45) Date of Patent: Feb. 11, 2014

(54) HEAT TRANSFER DEVICE WITH AT LEAST ONE SEMICONDUCTOR ELEMENT, PARTICULARLY A LASER OR LIGHT-EMITTING DIODE ELEMENT, AND METHOD FOR THE ASSEMBLY THEREOF

(75) Inventors: Matthias Schröder, Stadtroda (DE); Dirk Lorenzen, Fürstenberg (DE)

(73) Assignee: Jenoptik Laser GmbH, Jena (DE)

( * ) Notice: Subject to any disclaimer, the term of this patent is extended or adjusted under 35 U.S.C. 154(b) by 458 days.

(21) Appl. No.: 12/995,999

(22) PCT Filed: Jun. 2, 2009

(86) PCT No.: PCT/DE2009/000770
§ 371 (c)(1),
(2), (4) Date: Mar. 2, 2011

(87) PCT Pub. No.: WO2009/146683
PCT Pub. Date: Dec. 10, 2009

(65) Prior Publication Data
US 2011/0142087 A1   Jun. 16, 2011

(30) Foreign Application Priority Data
Jun. 2, 2008   (DE) .......................... 10 2008 026 801

(51) Int. Cl.
*H01S 3/04*   (2006.01)

(52) U.S. Cl.
USPC .......................................................... 372/36

(58) Field of Classification Search
USPC ............ 372/35, 36, 34; 257/E33.075; 156/67
See application file for complete search history.

(56) References Cited

U.S. PATENT DOCUMENTS

| 5,325,384 | A | 6/1994 | Herb et al. |
| 7,801,190 | B2 | 9/2010 | Lorenzen et al. |
| 2002/0110165 | A1 | 8/2002 | Filgas |

FOREIGN PATENT DOCUMENTS

| DE | 103 28 305 A1 | 1/2005 | |
| DE | 103283305 | * 1/2005 | .............. H01S 3/042 |
| JP | 2003 037325 A | 2/2003 | |
| JP | 2004 146720 A | 5/2004 | |
| JP | 2004146720 | * 5/2004 | .............. H01S 5/024 |
| KR | 10020000056651 | 9/2000 | |
| WO | WO 2006/098897 A1 | 9/2006 | |
| WO | WO 2007/082508 A1 | 7/2007 | |
| WO | WO 2008/027133 A1 | 3/2008 | |

OTHER PUBLICATIONS

English translation of the International Search Report for PCT/DE2009/000770, Jun. 7, 2010, 3 pages.
English translation of the Written Opinion of the International Searching Authority for PCT/DE2009/000770, Not dated, 6 pages.
D Lorenzen et al.: "Passively cooled diode lasers in the CW power range of 120-200W" Proc. of SPIE, vol. 6876, No. 6876Q (2008), 12 pages.
Office Action for German counterpart patent application 10 2008 026 801.1-54 to the present application, German Patent and Trademark Office, Jan. 4, 2009 (including English Translation thereof), 12 pages total.

* cited by examiner

*Primary Examiner* — Jessica Stultz
*Assistant Examiner* — Tuan Nguyen
(74) *Attorney, Agent, or Firm* — Skaar Ulbrich Macari, P.A.

(57) ABSTRACT

A semiconductor component on mutually opposing sides is joined in a first and a second bonded connection with a heat conducting body each. The heat-conducting bodies are joined in a third bonded connection in the region of the sections thereof extending away from the semiconductor element. A spacer, which with regard to the third connection, is disposed on the opposite side of the semiconductor component between the heat-conducting bodies, in conjunction with the joining zone thickness of the third connection being greater than that of the first or the second joining zone to ensure that defined joining zone thicknesses in the bonded connection is maintained during the joining process. The third connection can be used for at least partial heat transfer of the waste heat of the semiconductor component, particularly to a heat sink that is connected to the heat transfer device.

25 Claims, 2 Drawing Sheets

Fig. 1b

HEAT TRANSFER DEVICE WITH AT LEAST ONE SEMICONDUCTOR ELEMENT, PARTICULARLY A LASER OR LIGHT-EMITTING DIODE ELEMENT, AND METHOD FOR THE ASSEMBLY THEREOF

PRIORITY

This patent application claims the priority benefit of International Application PCT/DE2009/000770, filed on Jun. 2, 2009, and German patent application 10 2008 026 801.1, filed Jun. 2, 2008, the disclosure content of both of which is hereby incorporated by reference herein.

FIELD

The invention relates to a heat transfer device with at least one semiconductor component, in particular a laser or light-emitting diode element, according to the preamble of claim 1, and to a method for its assembly.

BACKGROUND

In order to reduce the thermal resistance of heat transfer devices which support the cooling of laser diode bars, it is known for example from the patent and unexamined patent applications U.S. Pat. No. 5,325,384, WO 2006 098 897 A1 and WO 2007 082 508 A1 to attach heat conducting bodies to opposing sides of the laser bar. If the heat removal capacity of the heat conducting bodies is different—for example because the heat sinks connected to the heat conducting bodies have a clearly different thermal resistance, the thermal resistance of the heat transfer device can be reduced by bringing both heat conducting bodies into thermal connection with each other in heat transfer sections beside the laser diode bar, with the result that a part of the heat of the more poorly cooled heat conducting body can be absorbed by the better cooled one. In extreme cases, only one of the heat conducting bodies is connected to a heat sink and must absorb virtually all of the heat of the laser diode bar absorbed by the other heat conducting body. Such an arrangement is known from publication no. 68760Q from Proc. SPIE vol. 6876 (2008) in which, in order to achieve a good thermal connection between the heat conducting bodies, a thermally highly conductive electrically insulating aluminium nitride ceramic plate was soldered with the help of two metallic solder layers on the side of the laser diode bar facing away from the light emission between the epitaxy-side metallic heat removal body and the substrate-side metallic heat conducting body.

With this and similar arrangements, there is the problem that the highly heat conductive intermediate element which is arranged between the heat transfer sections of the heat conducting bodies should preferably have the same thickness as the laser diode bars between its two sides, which are connected by heat absorbing sections of the heat conducting bodies for heat dissipation, in order that the thickness of the joining zones between the laser bar and the heat absorbing sections of the heat conducting bodies on the one hand and between the intermediate element and the heat transfer sections of the heat conducting bodies on the other hand can be kept the same on the one hand and kept constant over the extent of each joining zone on the other hand.

A constant, uniform and in particular small joining zone thickness is essential in particular for the connection of the laser diode bar in order to ensure a uniform quality and reliability of the diode laser that is both thermally and also electrically and optically highly loaded. The thickness of laser diode bars is different both within a batch and between several batches. The same applies to the intermediate elements. A reproducible matching of the thicknesses of laser diode bars and intermediate elements to less than 2 μm difference is either costly in production terms or accompanied by a time-consuming selection and allocation process.

SUMMARY

An object of the invention is therefore to describe a heat transfer device with a semiconductor component which eliminates the mentioned disadvantages.

The object of the invention is in particular to ensure a uniform and substantially constant thickness of the joining zones between the laser diode bars and the heat-absorbing heat conducting bodies in a continuous production process for diode lasers. At the same time, an object of the invention is to make possible a good heat transfer from one heat conducting body to another.

The object is achieved by a heat transfer device with at least one semiconductor component, in particular a laser or light-emitting diode element, with the characterizing features of claim 1, and a method for its assembly according to claim 15.

Seen from the semiconductor element, the spacer arranged between the support sections is located according to the invention on the other side of the heat transfer sections. When the heat conducting bodies are connected to one another and/or at least one heat conducting body is connected to the semiconductor component, it absorbs part of the compressive force which is exerted by one heat conducting body on the other during assembly, and sets the distance of the heat conducting bodies from one another between the support sections. Because of its preferably great distance from the semiconductor component, this distance need not correspond precisely to the thickness of the semiconductor component plus the first and second joining zones, and the angle error caused by a corresponding difference remains so small that a variation, caused by an angle error, in the thickness of the first and second joining zones is in the negligible range.

The thickness of the spacer, or the distance between the support points, is preferably matched to the positions of opposing support surfaces of the support sections in respect of the heat entry surfaces and the thickness of the semiconductor component such that none of the first and second joining zones can vary in thickness by more than +/−50%. Applied to support and heat entry surfaces which are arranged coplanar to each other on each of the two heat conducting bodies on a common axis oriented in a preferred direction, to a parallelepiped semiconductor component and to two equally thick first and second joining zones of average thickness d, the distance between the support points (the thickness of the spacer) preferably differs, at a distance in preferred direction from the centre of the semiconductor component which corresponds to p times the extent of the semiconductor component in preferred direction, by no more than +/−2d·(p−1) from the thickness of the semiconductor component.

If the support and heat entry surfaces are parallel to one another, but not coplanar, but offset relative to one another, the abovenamed allowed deviation thus increases or decreases for each such heat conducting body by precisely this offset.

Only the fact that the thickness of the third joining zone between the heat transfer sections is greater than the thicknesses of the first or second joining zone makes possible the supporting effect of the spacer, as otherwise the supporting effect lies in the area between the heat transfer sections, which is known to lead to the problems named at the outset on the one hand and has the undesired result on the other hand that the thickness of the third joining zone determines the thickness of at least one of the first and second joining zones.

However, for a reliable connection of a laser diode bar it is actually desirable that the thickness of the first and second joining zones determines that of the less important one—namely the third—which is effected by the supporting effect of the spacer during assembly with a thickness of the third joining zone that is greater compared with the first and second joining zones.

By joining zone is meant the layer of a solidified joining agent. Joining zone and joining gap differ in that the joining zone contains only joining agent, the joining gap at least one joining zone and optionally further components and joining zones which jointly fully bridge the joining gap by adhesion, bonding, welding or soldering.

Thus the third joining zone can fully extend over the joining gap, wherein the joining gap is filled fully and exclusively with joining agent. On the other hand, the third joining zone can also extend with respect to its thickness only over a part of the distance between the heat transfer sections which is determined by the joining gap. In this case, there can be arranged in the joining gap, in addition to the third joining zone, a fourth joining zone as well as an intermediate body positioned between the third and fourth joining zones. As joining agents as a rule display worse heat conducting properties than solids that cannot be used as joining agents it is advantageous, in the case of joint gaps the thicknesses of which correspond approximately to more than half the thickness of the semiconductor component, to use an intermediate body of metal (for example copper), ceramic (for example aluminium nitride) or crystal (for example diamond).

The order in which the adhesion bonding of the joining partners takes place, and whether and which joining agents and/or joining auxiliaries are used for connection, is unimportant. The adhesion bonding between the heat transfer sections can a) take place after the adhesion bond has been established between the semiconductor component and the first and the second heat conducting body. The adhesion bonding between the heat transfer sections can in addition b) take place at least at times jointly with the establishment of the adhesion bond between the semiconductor component and the second heat conducting body once the adhesion bond between the semiconductor component and the first heat conducting body has been established—or vice versa. Finally, c) the formation of the adhesion bond between the heat transfer sections can take place at least at times jointly with the formation of the connections by adhesion of the semiconductor component to both heat conducting bodies.

In all cases, as a result of its supporting effect the spacer ensures in at least the joining process in which both heat conducting bodies become bonded by adhesion to one another—by means of the semiconductor component via the first and second joining zones or in the region of the heat transfer sections via the third joining zone—a balanced joining zone thickness of the joining zones in the production of which it participates according to the invention.

It is advantageous according to the invention if the thickness of the third joining zone is greater than the thickness of the first or second joining zone which is formed at least at times together with the third.

If the thicknesses of the first and the second joining zones are similar and small—for example in the range of 1 micrometer to approximately 10 micrometers with a maximum thickness ratio of two—it is advantageous if the thickness of the third joining zone is greater than the thicknesses of the first and the second joining zones—whereby it is greater than whichever is the greater thickness of the first and the second joining zones.

To make the assembly requirements less burdensome, at least sections of the third joining zone have a greater thickness than the sum of the thicknesses of the first and second joining zones.

The invention establishes an efficient heat redirection by connection by adhesion bonding of heat conducting body parts beside of the semiconductor component, which itself is soldered with high-quality joining precision between the heat conducting bodies for efficient heat emission.

The use of a spacer during assembly does not necessarily mean that the spacer must remain in position after assembly. If the heat conducting bodies are metallic at least in the support sections and if their respective metallic region is electrically connected to the corresponding contact surfaces of the semiconductor component, an electrically conductive, preferably metallic, spacer can be used as shorting bridge between the metallic support sections which protects the semiconductor component against electrostatic discharges (ESD). When the assembled semiconductor component, for example a diode laser, is commissioned this shorting bridge is removed and can be reinserted again between the support sections following operation—shorting the semiconductor component.

For this, the heat conducting bodies preferably each have at least one metallic region or consist predominantly or completely of metal or an electrically conductive carbon-metal composite material, for example diamond-silver. The electrically conductive regions each extend from the support section into the heat absorbing section of the heat conducting body and are electrically connected to the corresponding contact surfaces of the semiconductor component. If facing heat transfer surfaces of the heat transfer section are each a constituent of these electrically conductive regions, the connection of the two heat transfer sections must have an electrical insulation—either in the form of an electrically insulating intermediate body or in the form of a joining zone with an electrically insulating joining agent.

If on the other hand only one, or none, of the facing heat transfer surfaces of the heat transfer sections is a constituent of these electrically conductive regions, an electrically conductive joining agent—for example a metallic solder—can also be used to connect the two heat transfer sections without an electrically insulating intermediate body having to be used. In this case, both heat conducting bodies can be directly connected to each other by a single metallic solder layer. This is possible inter alia with heat conducting bodies that consist predominantly of highly heat conductive electrically insulating materials, for example aluminium nitride, beryllium oxide, diamond etc., and carry electric conductors which extend from opposing support surfaces of the support sections to opposing heat entry surfaces of the heat absorbing sections. Further metallic conductors can be attached to opposing surfaces of the heat transfer sections without being electrically connected to the semiconductor component, in order to facilitate the direct connection of the heat conducting bodies with the help of a metallic solder. An active solder which wets the non-metallic regions of the heat transfer sections can naturally equally be used to form the connection.

When using metallic heat conducting bodies, it advantageous to dispense with an electrically insulating intermediate element in favour of an electrically insulating joining agent for production and financial reasons. While the thickness of the electrically insulating joining zone should be as small as possible on thermal grounds, the assembly technique according to the invention requires a thickness of the third joining zone of at least the smaller of the thicknesses of the first and the second joining zones. In addition, it is necessary on electrical grounds to have a thickness which is large enough to reliably ensure the electrical insulation in the production process. Where the thicknesses of the first and second joining zones are small and similar, it is advantageous if the thickness of the third joining zone is greater than the greater of the thicknesses of the first and second joining zones; preferably it is actually greater than their sum.

If the spacer is to remain in position after assembly is complete—for example because it was secured to at least one heat conducting body during or before assembly or by adhesion—an electrically insulating spacer is to be used when using heat conducting bodies the opposing support surfaces of which form part of metallic regions which are electrically connected to the semiconductor component.

In this sense, it is also clear that the spacer need at no time necessarily be present as a separate component. While in principle, on symmetry grounds vis-à-vis the semiconductor component and the concomitant simplification of the achievement of the required joint tolerances, preference is to be given to the spacer as a distinct physical entity, in a less preferred development of the invention the spacer is an integral constituent of at least one of the two heat conducting bodies and is present in the form of a raised section which projects out of the support section out over the heat transfer section in the direction of the semiconductor component. Advantageously, the number of components used for assembly would thus be reducible by one from five to four or from four to three.

Preferably, the electrical connection of the semiconductor component takes place without adding further bodies or components in the heat transfer device by means of the heat conducting bodies, to which end heat entry surfaces rest on metallic regions of the heat absorbing sections. Preferably, both heat conducting bodies are metallic. The heat conducting bodies are preferably connected to the contact surfaces with a metallic solder—for example gold-tin, indium etc.

Preferably, the heat conducting bodies are formed plate-shaped.

In order to ensure a high thermal conductance of the heat conducting plates, the thickness of the plates in perpendicular direction to at least one of the contact surfaces is preferably greater than at least one lateral dimension of the semiconductor component parallel to one or both contact surfaces. Transferred to individual laser diodes, this means that plate thickness is greater than the width of the laser diode directed perpendicular to the light emission direction/resonator length and parallel to the plane of one or both contact surfaces; transferred to laser diode bars this means that plate thickness is greater than the resonator length of the laser diode bar.

In order to ensure a high thermal conductance of the joining zone, the areal extent of the joining zones is greater than the parallel areal extent of the laser diode element.

BRIEF DESCRIPTION OF THE FIGURES

The invention is explained in more detail below with the help of embodiment examples. There are shown in FIG. 1a a side view of the components of a first embodiment example of the heat transfer device according to the invention, FIG. 1b a side view of the first embodiment example of the heat transfer device according to the invention, FIG. 2a a side view of the components of a second embodiment example of the heat transfer device according to the invention, FIG. 2b a side view of the second embodiment example of the heat transfer device according to the invention.

DETAILED DESCRIPTION

All embodiment examples represent diode laser components with a laser diode bar. Equally, they can also represent radiation sources with one or more single or multiple emitter laser diodes or single or multiple emitter light-emitting diodes or light-emitting diode bars arranged alongside one another. In addition, the heat transfer device is also suitable for cooling semiconductor switching elements, for example high-power transistors, high-power thyristors etc.

Embodiment Example 1

Figure 1A:
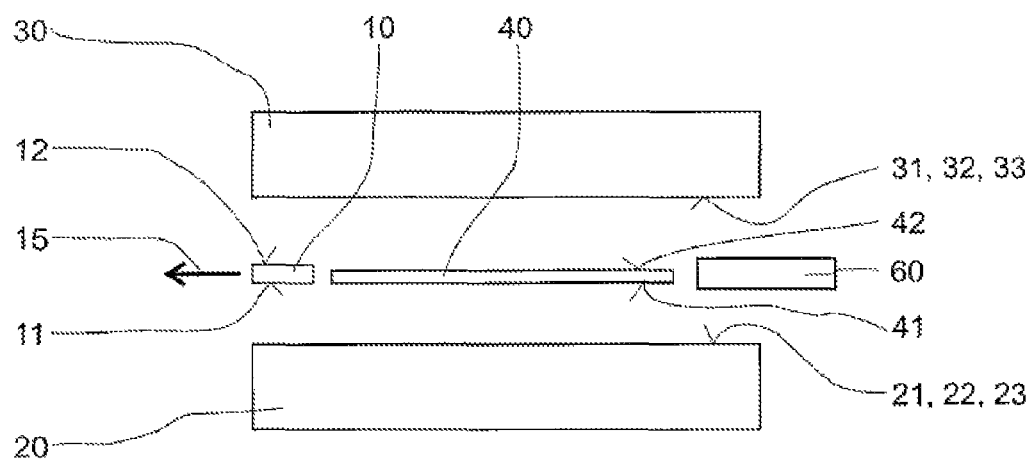

The components used for the production of a first variant of the first embodiment example of the heat transfer device according to the invention are shown in FIG. 1a: The laser diode bar 10 has a first, epitaxy-side contact surface 11 for electrical connection as well as a second, substrate-side contact surface 12 opposite the epitaxy-side contact surface. The laser diode bar has a resonator length of 2 mm. The light emission taking place during operation is identified by the arrow 15 which is arranged on an optical axis. A 100-μm thick aluminium nitride ceramic plate 40 is arranged behind the 120-μm thick laser diode bar in the opposite direction to light emission. It has opposing metallized heat transfer surfaces 41 and 42 oriented epitaxy- and substrate-side.

A first, epitaxy-side, plate-shaped heat conducting body 20 consists predominantly of a diamond-silver composite and has a heat entry surface 21 opposite the epitaxy-side contact surface 11 as well as a heat transfer surface 22 which lies opposite the epitaxy-side heat transfer surface 41 of the aluminium nitride ceramic plate 40. It is 4 mm thick.

A second, substrate-side, plate-shaped heat conducting body 30 likewise consists predominantly of a diamond-silver composite and has a heat entry surface 31 opposite the substrate-side contact surface 12 as well as a heat transfer surface 32 which lies opposite the substrate-side heat transfer surface 42 of the aluminium nitride ceramic plate 40. It is likewise 4 mm thick.

The length of the aluminium nitride ceramic plate 40 —i.e. its extent in a preferred direction which corresponds to the extension direction of the heat conducting bodies 20/30 from the heat absorbing section 25/35 to the support section 27/37 (from left to right in the drawing plane) —is 10 mm.

In preparation for the establishment of an adhesion bond or material closure between these components 10, 20, 30, 40 for the formation of the first variant of the first embodiment example, the epitaxy-side heat conducting body 20 is coated with 5 μm gold-tin solder in the region of the epitaxy-side heat entry surface 21 and in the region of the epitaxy-side heat transfer surface 22. Analogously, the substrate-side heat conducting body 30 is coated with 5 μm gold-tin solder in the region of the substrate-side heat entry surface 31 and in the region of the substrate-side heat transfer surface 32.

Furthermore, a foil of a gold-tin solder preform 25 μm thick is introduced between the solder layer on the substrate-side heat transfer surface 32 of the epitaxy-side heat conducting body 20 and the substrate-side heat transfer surface 42 of the aluminium nitride ceramic plate 40. Arranged on the side of the aluminium nitride ceramic plate 40 facing away from the laser diode bar 10 is a high-grade steel foil 60 125 μm thick as spacer between two opposing support surfaces 23 and 33 of the epitaxy-side heat conducting body 20 and of the substrate-side heat conducting body 30.

Figure 1B:
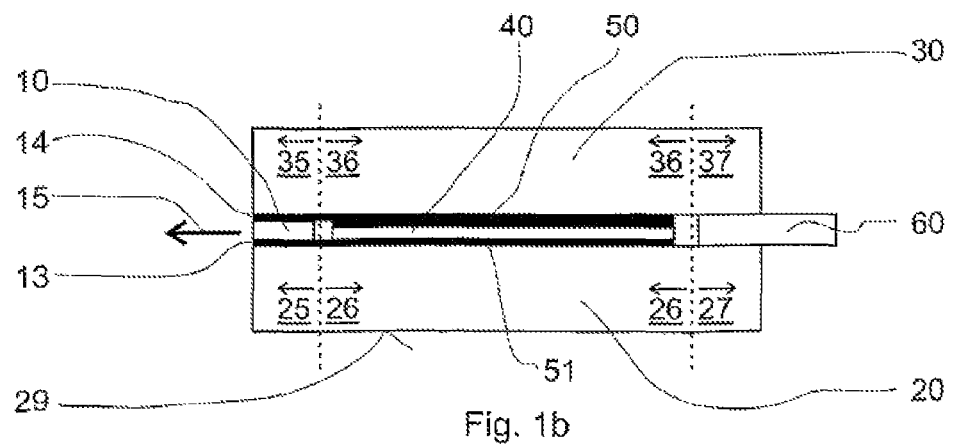

Different sections of the heat conducting body with different functions are highlighted in FIG. 1b by dotted dividing lines.

To establish the adhesion bond between the components 10, 20, 30, 40 to be joined, in a first joining process the laser diode bar 10 is soldered epitaxy-side onto the epitaxy-side heat absorbing section of the epitaxy-side heat conducting body 20 and the aluminium nitride ceramic plate 40 onto the epitaxy-side heat transfer section 26 of the epitaxy-side heat conducting body 20.

In preparation for the second joining process, which is to connect the substrate-side heat conducting body 30 to the laser diode bar 10 and the aluminium nitride ceramic plate 40, it is to be taken into account that the stack comprising aluminium nitride ceramic block 40 and solder preform together with the solder layers is at 135 μm the highest point above the plane of the surfaces 21, 22 and 23 compared with the plane of the surfaces 31, 32 and 33. Against this, the laser diode bar together with the solder layers is only 130 μm high while the spacer is 125 μm high. Thus the substrate-side heat conducting body rests only in the region of the heat transfer section.

During the second joining process the solder preform melts and yields under a pressure exerted via the substrate-side on the epitaxy-side heat conducting body. In doing so the substrate-side heat absorbing section 31 comes into contact with the substrate-side contact surface 12 of the laser diode bar and the substrate-side support section in contact with the spacer which rests on the epitaxy-side support section.

At the end of the assembly process, all components have passed through temperature profiles which are suitable to establish both a high-quality soldered connection 13 between the laser diode bar 10 and an epitaxy-side heat absorbing section 25 of the epitaxy-side heat conducting body 20 and a high-quality soldered connection 14 between the laser diode bar 10 and a substrate-side heat absorbing section 35 of the substrate-side heat conducting body 30, and a high-grade soldered connection 51 between the aluminium nitride ceramic plate 40 and an epitaxy-side heat transfer section 26, extending against the direction of light emission 15 beyond the laser diode bar 10, of the epitaxy-side heat conducting body 20, and a high-quality soldered connection 50 between the aluminium nitride ceramic plate 40 and a substrate-side heat transfer section 36, extending against the direction of light emission 15 beyond the laser diode bar 10, of the substrate-side heat conducting body 30.

The soldered connection 50 has a greater thickness than the other three soldered connections 13, 14 and 51. It bridges the certain tolerance of the distance to the substrate-side heat conducting body of the aluminium nitride ceramic plate 40 produced with too small thickness.

The spacer 60 prevents the components from tipping towards one another into the solder layer 50 and ensures that the thicknesses of the joining zones 13 and 14 are likewise substantially constant like the thicknesses of the joining zones 50 and 51.

It can be assumed in a simplified description of the joining process that the solder layer thicknesses of all solder layers in the joining process, with the exception of that of the solder preform, do not change, while the thickness of the solder layer of the solder preform adapts to the distances determined by the laser diode bar 10 together with its solder layers (130 μm in total) and the spacer 60 (125 μm). Thus the thickness of the solder of the solder preform decreases by 20% to 40% to 15 to 20 μm. The joining process involves the emergence from the solder layers of joining zones the thickness of which, with the exception of that of the first soldered connection 50, corresponds to that of the solder layers. The thickness of the joining zone 50 between the aluminium nitride ceramic plate 40 and the substrate-side heat transfer section 36 of the substrate-side heat conducting body 30 varies tapering from 25 μm on the side facing the laser diode bar 10 to 20 μm on the side facing the support element. Overall, the joining gap between the epitaxy-side heat transfer section 26 and the substrate-side heat transfer section 36 also runs tapered because its thickness, which corresponds to the distance between the two heat transfer sections 26 and 36, is determined by the spacers between the heat entry sections 25 and 35 (laser diode bar 10 with soldered connections 13 and 14) and between the support sections 27 and 37 (spacer 60). At the end facing the laser diode bar 10, it is 130 μm thick, at the end facing the spacer 60 125 μm thick.

To operate the laser diode bar in the heat transfer device, a heat sink is secured to a heat emitting surface which is arranged on a side 29 facing away from the laser diode bar 10 and the aluminium nitride ceramic plate 40 of the epitaxy-side heat conducting body 20; a first electrical connection is attached to the epitaxy-side heat conducting body 20 and a second electrical connection to the substrate-side heat conducting body 30. The spacer shorting the epitaxy-side and substrate-side contact of the laser diode bar 10 via the heat conducting bodies 20 and 30 is moved out of its position.

During operation of the laser diode bar, a first part of the heat produced in the active zone is absorbed by the epitaxy-side heat absorbing section 25 of the epitaxy-side heat conducting body 20 via the epitaxy-side contact surface 11, the epitaxy-side soldered connection 13 and the epitaxy-side heat entry surface 21 and spread at least partly into the epitaxy-side heat transfer section 26. A second part of the heat is absorbed by the substrate-side heat absorbing section 35 of the substrate-side heat conducting body 30 via the substrate-side contact surface 12, the substrate-side soldered connection 14 and the substrate-side heat entry surface 31 and at least almost all of it conducted into the substrate-side heat transfer section 36. From the substrate-side heat transfer section 36, the second heat part is transferred via the substrate-side heat transfer surface 32, the soldered connection 50, the substrate-side heat transfer surface 42, the aluminium nitride ceramic plate 40, the epitaxy-side heat transfer surface 41, the soldered connection 51 and the epitaxy-side heat transfer surface 22 into the epitaxy-side heat transfer section 26 of the epitaxy-side heat conducting body 20 where it is combined with the first heat part. The heat is then discharged via the heat emitting surface 29 to a heat sink body for heat removal.

The aluminium nitride ceramic plate 40 ensures an electrical insulation between the heat conducting bodies 20 and 30 between which there must be a suitable potential difference for the operation of the laser diode bar. As the thickness of the aluminium nitride ceramic plate 40 is only slightly less than that of the laser diode bar, the thicknesses of the soldered connections 50 and 51 are also relatively small, namely 25 μm and 5 μm. Despite the moderate heat conductivity of gold-tin solder, when account is taken of the high thermal conductivity of the aluminium nitride ceramic plate 40, the thermal resistance of the heat transfer from substrate-side heat transfer section 36 to the epitaxy-side heat transfer section 26 therefore remains small.

Thus the substrate-side heat conducting body can in fact be used efficiently for the cooling of the laser diode bar on both sides.

Embodiment Example 2

Unlike the first embodiment example, the second embodiment example manages without using a plate 40 introduced between the heat conducting bodies for electrical insulation.

Instead, a joining zone with an electrical insulating joining agent is used for the electrically insulating connection of the heat conducting bodies. For this, at least one of the heat conducting bodies 20, 30 —in the present embodiment example both heat conducting bodies 20 and 20 —is provided with a raised section in the region of the heat transfer section 26, 36, which extends in the adhesion-bonded heat transfer device to the back alignment of the laser diode bar 10, i.e. between the two contact surface planes. Thus the heat entry surfaces 21, 31 of the heat absorbing sections 25, 35 each lie together with the support surfaces 23, 33 of the support sections 27, 37 in a common plane which for its part lies offset parallel vis-à-vis the planes of the heat transfer surfaces 22, 32 in the heat transfer sections 26, 36.

Unlike the first embodiment example, the second embodiment example manages with only a minimum of components.

Figure 2A:
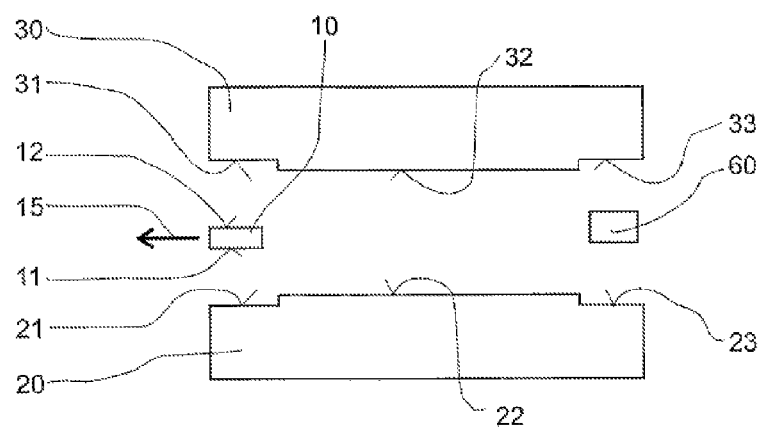
Figure 2B:
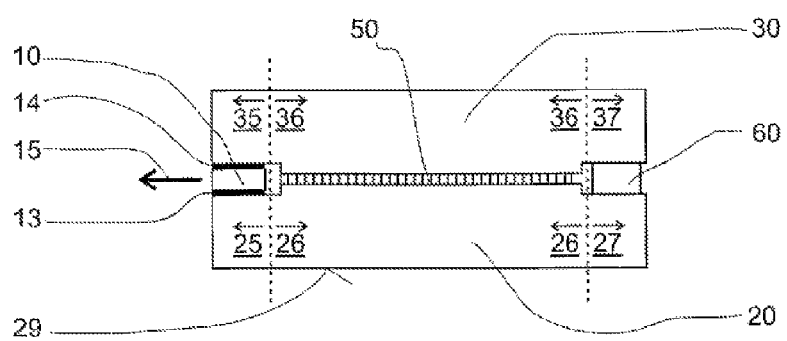

The components of the second embodiment example are shown in FIG. 2a. The heat conducting bodies 20 and 30 consist predominantly of copper. The heat entry surfaces 21 and 31 at the base of recesses in the heat absorbing sections 25 and 35 are offset parallel by 50 μm, in the direction pointing away from the laser diode bar, vis-à-vis the heat transfer surfaces 22 and 32 in the heat transfer sections 26 and 36. The pair of recesses provides space, as illustrated in FIG. 2b, to house the laser diode bar 10, which is soldered by adhesion on both sides to the heat absorbing sections 25 and 35 of the heat conducting bodies 20 and 30 with indium solder 13 and 14 in a single soldering process.

Likewise, the support surfaces 23 and 33 at the base of recesses in the support sections 27 and 37 are offset parallel by 50 μm, in the direction pointing away from the laser diode bar, vis-á-vis the heat transfer surfaces 22 and 32 in the heat transfer sections 26 and 36. This pair of recesses provides space, as illustrated in FIG. 2b, to house a polyimide foil 40 125 μm thick which is secured by means of an adhesive to the support surface 23, 33 of one of the heat conducting bodies 20, 30 before carrying out the abovenamed soldering process.

Together with the mentioned soldering process, an electrically insulating adhesive layer 50 previously introduced between the two heat transfer sections 26 and 36 of the heat conducting bodies 20 and 30 hardens in material closure manner. When initiating the soldering process, the polyimide foil as spacer ensures, when a compressive force is exerted by the substrate-side heat conducting body 20 on the epitaxy-side heat conducting body 30, that a thickness of the electrically insulating adhesive layer 50 in the region of 25 to 30 μm forms which reliably ensures the electrical insulation of the metallic heat conducting bodies from one another. At the same time, an indium solder layer of sufficient thickness homogeneity is ensured.

The polyimide film remains in the heat transfer device after assembly has ended.

List of Reference Numbers
10 laser diode element
11 epitaxy-side contact surface
12 substrate-side contact surface
13 epitaxy-side soldered connection
14 substrate-side soldered connection
15 arrow showing direction of radiation emission
20 epitaxy-side heat conducting body
21 epitaxy-side heat entry surface
22 epitaxy-side heat transfer surface
23 epitaxy-side support surface
25 epitaxy-side heat absorbing section
26 epitaxy-side heat transfer section
27 epitaxy-side support section
29 heat emitting surface
30 substrate-side heat conducting body
31 substrate-side heat entry surface
32 substrate-side heat transfer surface
33 substrate-side support surface
35 substrate-side heat absorbing section
36 substrate-side heat transfer section
37 substrate-side support section
40 electrically insulating plate
41 epitaxy-side transfer surface
42 substrate-side transfer surface
50 first joining zone between heat transfer sections
51 second joining zone between heat transfer sections
60 spacer While the invention has been described in connection with what is presently considered to be the most practical and preferred embodiments, it will be apparent to those of ordinary skill in the art that the invention is not to be limited to the disclosed embodiments. It will be readily apparent to those of ordinary skill in the art that many modifications and equivalent arrangements can be made thereof without departing from the spirit and scope of the present disclosure, such scope to be accorded the broadest interpretation of the appended claims so as to encompass all equivalent structures and products.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A Heat transfer device comprising:
   a first heat conducting body, including a first heat absorbing section, a first heat entry surface, a first heat transfer section and a first support section;
   a second heat conducting body, including a second heat absorbing section, a second heat entry surface, a second heat transfer section and a second support section;
   at least one semiconductor component at least partially disposed between first heat conducting body and the second heat conducting body, the at least one semiconductor component comprising one or both of a laser and a light-emitting diode element, the semiconductor component including a first side, a first contact surface on the first side, a second side opposite the first side, and a second contact surface on the second side,
   wherein at least a portion of the first contact surface is substantially flat and at least a portion of the second contact surface is substantially flat,
   wherein at least a section of the first heat entry surface is arranged opposite the first contact surface in a direction facing away from the semiconductor component,
   wherein a first joining zone is located between the first heat entry surface and the first contact surface, the first joining zone having a thickness oriented perpendicular to the first contact surface and extending from the first contact surface to the first heat entry surface,
   wherein the first heat transfer section at least partially extends beyond the semiconductor component in a first heat transfer direction parallel to the first contact surface,
   wherein at least a section of the second heat entry surface is arranged opposite the second contact surface in a direction facing away from the semiconductor component, wherein a second joining zone is located between the second heat entry surface and the second contact surface, the second joining zone having a thickness oriented perpendicular to the second contact surface and extending from the second contact surface to the second heat entry surface, wherein the second heat transfer section at least partially extends beyond the semiconductor component in a second heat transfer direction parallel to the second contact surface, wherein at least a portion of the second heat transfer section lies opposite at least a portion of the first heat transfer section, wherein the first heat transfer section is thermally connected to the second heat transfer section via a joining gap defining a third joining zone, the third joining zone having a thickness defined between the first contact surface to the second contact surface and oriented perpendicular to the second contact surface, wherein the first support section is adjacent the first heat transfer section and the second support section is adjacent the second heat transfer section, wherein at least a portion of the first support section lies opposite at least a portion of the second support section, the respective portions of the first support section and second support section arranged opposite each other being separated by a spacer, and wherein at least in a section of the third joining zone the thickness of the third joining zone is thicker than the thickness of at least one of the first joining zone and the second joining zone.

2. The heat transfer device according to claim 1, wherein the spacer is a distinct component separate from both of the first and second heat conducting bodies.

3. The heat transfer device according to claim 1, wherein the spacer is integrated into at least one of the first or second heat conducting bodies.

4. The heat transfer device according to claim 1, wherein the spacer is arranged at least partly between the planes in which the first and second contact surfaces of the semiconductor component lie.

5. The heat transfer device according to claim 1, wherein the spacer comprises an electrical insulator.

6. The heat transfer device according to claim 1, wherein the thickness of the spacer in a direction perpendicular to at least one of the first or second contact surfaces differs by less than 50% from the distance between the first and second contact surfaces.

7. The heat transfer device according to claim 1, wherein the thickness of the spacer in a direction perpendicular to at least one of the first or second contact surfaces is greater than the distance between the first and second contact surfaces.

8. The heat transfer device according to claim 1, wherein the semiconductor component is a laser diode bar, comprising at least one optical axis of radiation emission, and the dimension of at least one of the heat conducting bodies on at least a straight line which lies perpendicular to at least one of the contact surfaces of the laser diode bar in at least one plane which extends perpendicular to at least one of the contact surfaces of the laser diode bar and parallel to the optical axis of radiation emission through the said heat conducting bodies and the laser diode bar, is greater than at least one extension of the laser diode bar lying in the plane and being aligned parallel to at least one of the contact surfaces.

9. The heat transfer device according to claim 8, wherein at least one extension of the joining zone in the plane is at least twice as great as the at least one extension of the laser diode bar lying in the said plane and being aligned parallel to at least one of the contact surfaces.

10. The heat transfer device according to claim 1, wherein the first and second support sections provide support surfaces on which the spacer rests and for resting on the spacer.

11. The heat transfer device according to claim 10, wherein the support surface of at least one of the heat conducting bodies lies in a common plane with the heat entry surface of the same heat conducting body apart from a parallel offset which is determined by joining zones.

12. The heat transfer device according to claim 1, wherein the first and the second heat conducting bodies each have at least one surface recess, sections at least of which are arranged in a respective heat entry section, the surface recess including a base surface sectionally forming the respective first or second heat entry surface and sections at least of which house the semiconductor component, and the surface recess at least in part arranged in the support section, the base surface of said surface recess at least sectionally forms the support surface wherein the first and the second heat transfer sections are arranged at least partly between the planes in which the first and second contact surfaces of the semiconductor component lie.

13. The heat transfer device according to claim 1, wherein the first heat transfer section includes a first metallic region which is electrically connected to the first contact surface of the semiconductor component, the second heat transfer section includes a second metallic region which is electrically connected to the second contact surface of the semiconductor component, and at least a portion of the third joining zone has an electrically insulating joining agent which, in at least a part region of the joining gap, bridges at least half of the gap there between the first and second metallic regions by adhesion.

14. The heat transfer device according to claim 1, wherein the first and the second heat conducting bodies generally comprise one or both of copper and a carbon-metal composite.

15. The heat transfer device according to claim 1, wherein the first joining zone is defined by firmly bonding and the second joining zone is defined by firmly bonding.

16. A method for assembling a semiconductor component, comprising:
   a) introducing at least a portion of a semiconductor component, the semiconductor component comprising a first side, a first contact surface including at least a portion of which is substantially flat, a second side facing away from the first side, and a second contact surface including at least a portion of which is substantially flat, between a first and a second heat conducting body, wherein at least a portion of the first contact surface lies opposite a first heat entry surface of a first heat absorbing section of a first heat conducting body in a direction facing away from the semiconductor component, and wherein at least a portion of the second contact surface lies opposite a second heat entry surface of a second heat absorbing section of a second heat conducting body in a direction facing away from the semiconductor component;
   b) connecting the first heat absorbing section to the semiconductor component with formation of a first joining zone which extends in the line, oriented perpendicular to the first contact surface, of the semiconductor component from the first contact surface to the first heat entry surface;
   c) connecting the second heat absorbing section to the semiconductor component with formation of a second joining zone which extends in the line, oriented perpendicular to the second contact surface, of the semiconductor component from the second contact surface to the second heat entry surface;

d) connecting of opposing regions of a first heat transfer section of the first heat conducting body sections at least of which extend beyond the semiconductor component in at least a first heat transfer direction parallel to the first contact surface, and connecting of opposing regions of a second heat transfer section of the heat conducting body sections at least of which extend beyond the semiconductor component in at least a second heat transfer direction parallel to the second contact surface, with formation of a third joining zone sections, at least a portion of which have a greater thickness than the first or the second joining zone; and e) exerting of at least a compressive force during at least one of the steps b), c) and d) by one support section on another support section of the heat conducting bodies via a spacer, at least a portion of which is arranged in a support position between opposing regions of a first support section of the first heat conducting body which adjoins the first heat transfer section, and of a second support section of the second heat conducting body which adjoins the second heat transfer section.

17. The method for assembling a semiconductor component according to claim 16, wherein the method steps b) and d) or the method steps c) and d) take place at least at times in a common connection process, wherein the thickness of sections at least of the third joining zone is greater than the thickness of whichever of the first or second joining zones is formed at least at times jointly with the third joining zone.

18. The method for assembling a semiconductor component according to claim 17, wherein in preparation for the method step d) an electrically insulating joining agent is introduced between the heat transfer sections of the two heat conducting bodies.

19. The method for assembling a semiconductor component according to claim 16, wherein in preparation for method step e) the spacer is introduced between the support sections of the heat conducting bodies and during method step e) rests in the support position on a pressure-receiving support surface of the support section and a pressure-exerting support surface of the other support section rests on the spacer.

20. The method for assembling a semiconductor component according to claim 16, wherein the method steps b), c) and d) take place at least at times in a common connection process, wherein the thickness of sections at least of the third joining zone is greater than the sum of the thicknesses of the first and second joining zones.

21. The method for assembling a semiconductor component according to claim 20, wherein the spacer is removed from its support position in order to operate the semiconductor component.

22. The method for assembling a semiconductor component according to claim 16, wherein the spacer is electrically conductive and in its support position electrically connects a first metallic region, which is electrically connected to the first contact surface of the semiconductor component, to a second metallic region which is electrically connected to the second contact surface of the semiconductor component.

23. The method for assembling a semiconductor component according to claim 22, wherein the first heat conducting body contains the first metallic region and the second heat conducting body the second metallic region.

24. The method for assembling a semiconductor component according to claim 16, wherein in order to operate the semiconductor component, at least one of the heat conducting bodies on a side facing away from the semiconductor component is connected to at least one heat sink.

25. The method for assembling a semiconductor component according to claim 16, wherein connecting in steps b, c, and d is carried out by firmly bonding.

* * * * *